(12) United States Patent
Cheng et al.

(10) Patent No.: US 12,347,772 B2
(45) Date of Patent: Jul. 1, 2025

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Kuang-Wei Cheng, Hsinchu (TW); Chyi-Tsong Ni, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 734 days.

(21) Appl. No.: 17/459,758

(22) Filed: Aug. 27, 2021

(65) Prior Publication Data

US 2023/0069557 A1    Mar. 2, 2023

(51) Int. Cl.
*H01L 23/528*    (2006.01)
*H01L 21/768*    (2006.01)

(52) U.S. Cl.
CPC .... *H01L 23/5283* (2013.01); *H01L 21/76832* (2013.01); *H01L 21/76837* (2013.01); *H01L 21/76885* (2013.01)

(58) Field of Classification Search
None
See application file for complete search history.

(56) References Cited

U.S. PATENT DOCUMENTS

| | | | |
|---|---|---|---|
| 6,365,523 B1* | 4/2002 | Jang | H01L 21/31053 438/692 |
| 2006/0166514 A1* | 7/2006 | Cheng | H01L 21/02271 257/E21.279 |
| 2007/0123024 A1* | 5/2007 | Pallinti | H01L 24/48 438/618 |
| 2017/0179330 A1 | 6/2017 | Suen et al. | |
| 2018/0233466 A1* | 8/2018 | Yen | H01L 24/03 |

FOREIGN PATENT DOCUMENTS

| | | |
|---|---|---|
| TW | 201832302 A | 9/2018 |
| TW | 202131396 A | 8/2021 |

OTHER PUBLICATIONS

Taiwan Office Action issued in connection with TW Appl. Ser. No. 111100885 dated Jan. 9, 2023 (without English translation).

\* cited by examiner

*Primary Examiner* — Xiaoming Liu
(74) *Attorney, Agent, or Firm* — FOLEY & LARDNER LLP

(57) ABSTRACT

A method of fabricating a semiconductor device is described. A semiconductor substrate having at least one electrical component is provided. A patterned wiring layer is formed above the semiconductor substrate. The patterned wiring layer includes a plurality of wiring portions, where adjacent of the wiring portions are separated from each other. A first insulating passivation layer is formed over the wiring portions in a region between adjacent wiring portions. The first insulating passivation layer has a horizontal surface in the region between adjacent wiring portions. A second insulating passivation layer is formed on the first insulating passivation layer, wherein the first insulating passivation layer has a side surface which makes an angle with the horizontal surface of greater than 103°.

21 Claims, 10 Drawing Sheets

SEMICONDUCTOR DEVICES AND METHODS OF MANUFACTURING THEREOF

BACKGROUND

This disclosure relates generally to a semiconductor device, and in some embodiments, to semiconductor devices that include multiple passivation layers.

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
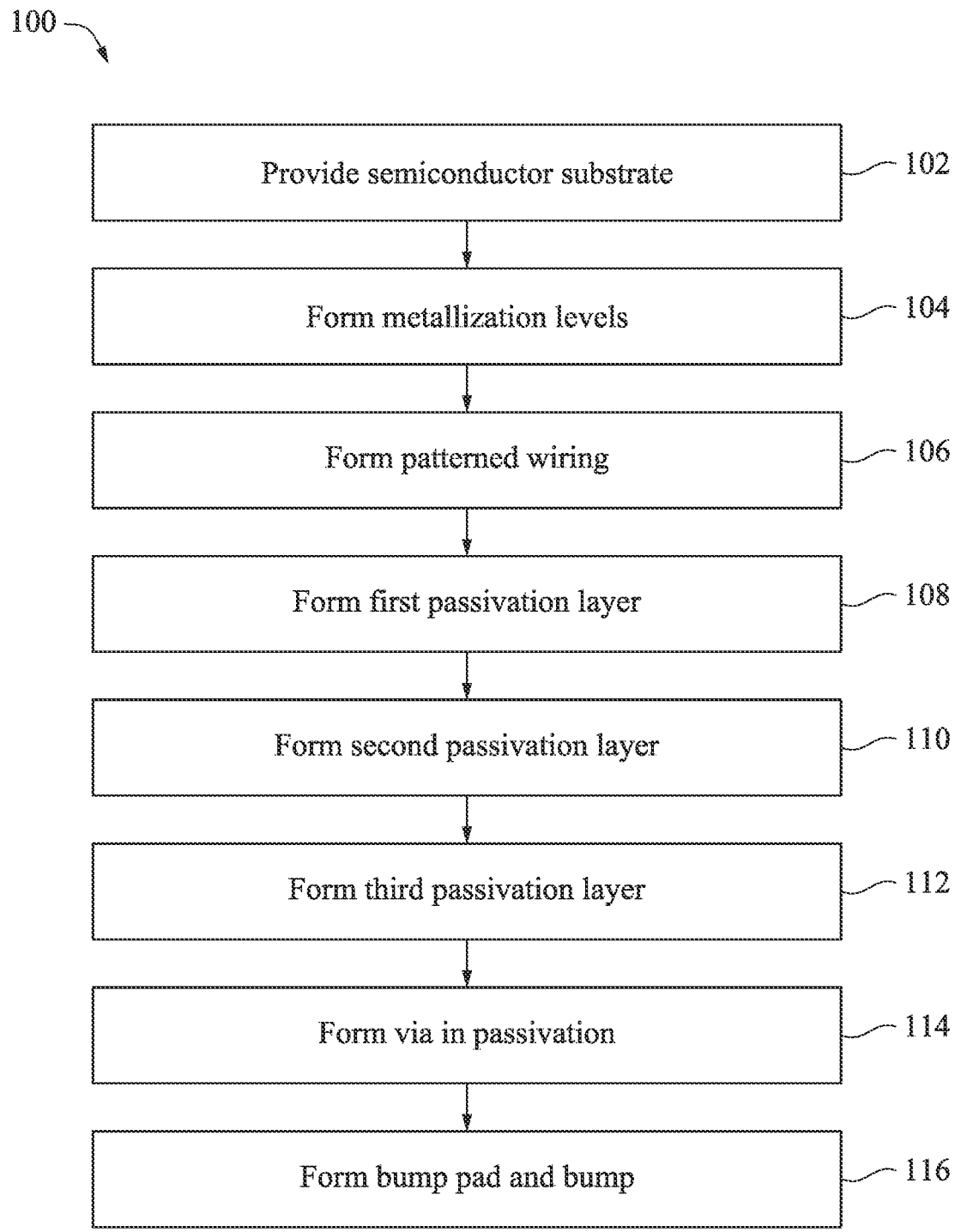
FIG. 1 illustrates a flow chart of an example method to make a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In contemporary semiconductor device fabrication processes, a large number of semiconductor devices, such as field effect transistors ("FETs"), are fabricated on a single wafer. Non-planar transistor device architectures, such as fin-based transistors (typically referred to as "FinFETs"), can provide increased device density and increased performance over planar transistors. Some advanced non-planar transistor device architectures, such as nanosheet (or nanowire) transistors, can further increase the performance over the FinFETs. When compared to the FinFET where the channel is partially wrapped (e.g., straddled) by a gate structure, the nanosheet transistor, in general, includes a gate structure that wraps around the full perimeter of one or more nanosheets for improved control of channel current flow. For example, in a FinFET and a nanosheet transistor with similar dimensions, the nanosheet transistor can present larger driving current ($I_{on}$), smaller subthreshold leakage current ($I_{off}$), etc. Such a transistor that has a gate structure fully wrapping around its channel is typically referred to as a gate-all-around (GAA) transistor of GAAFET.

The present disclosure provides various embodiments of a semiconductor device, which may include a planar transistor, or a non-planar transistor such as a FinFET, GAAFET, or nanosheet FET (NSFET) transistor. Embodiments of the present disclosure are discussed in the context of forming a planar transistor, or a non-planar transistor, such as a FinFET, GAAFET, or NSFET transistor, and in particular, in the context of a method of fabricating a semiconductor device.

A semiconductor substrate having at least one electrical component is provided. A patterned wiring layer is formed above the semiconductor substrate. The patterned wiring layer includes a plurality of wiring portions. Adjacent of the wiring portions are separated from each other. A first insulating passivation layer is formed over the wiring portions in a region between adjacent of the wiring lines. The first insulating passivation layer has a horizontal surface in the region between adjacent of the wiring portions. A second insulating passivation layer is formed on the first insulating passivation layer. The first insulating passivation layer may have a side surface which makes an angle with the horizontal surface of greater than 103°. The second insulating passivation layer has compressive stress. The first insulating passivation layer and the second insulating passivation layer do not have a void in the region between adjacent wiring lines.

A semiconductor device formed by the above described method, where the side surface makes an angle with the horizontal surface of greater than 103°, can advantageously provide a device where the passivation layers are void free, and thus reduce the weak points in the device such as pin holes. Other values are within the scope of the disclosure. The second insulating passivation layer with compressive stress can compensate for tensile stress in the wiring portions. Thus passivation layer cracks may be reduced.

FIG. 1 illustrates a flowchart of a method 100 to form a semiconductor device, according to one or more embodiments of the present disclosure. For example, at least some of the operations (or steps) of the method 100 can be used to form a FinFET (or a GAA) transistor device. Further, the method 100 can be used to form a FinFET transistor (or GAA transistor) device in a respective conduction type such as, for example, an n-type transistor device or a p-type transistor device. The term "n-type," as used herein, may be referred to as the conduction type of a transistor having electrons as its conduction carriers, and the term "p-type," as used herein, may be referred to as the conduction type of a transistor having holes as its conduction carriers.

Referring to FIG. 1, the method 100 starts with operation 102 in which a semiconductor substrate is provided. The method 100 continues to operation 104 in which metallization levels are formed. The method 100 continues to operation 106 in which patterned wiring is formed over the metallization levels. The method 100 continues to operation 108 in which a first passivation layer (first insulating passivation layer) is formed over the patterned wiring. The method 100 continues to operation 110 in which a second passivation layer (second insulating passivation layer) is formed over the first passivation layer. The method 100 continues to operation 112 in which a third passivation layer (third insulating passivation layer) is formed over the second passivation layer. The method 100 continues to operation 114 in which a via is formed in the first passivation layer, second passivation layer and third passivation layer. The method 100 continues to operation 116 in which a bump pad and a bump are formed in the via.

In the following discussions, the operations of the method 100 may be associated with views of a semiconductor device 200 at various fabrication stages. In some embodiments, the semiconductor device 200 may include a planar transistor. In some embodiments, the semiconductor device 200 may include a FinFET. In other embodiments the semiconductor device 200 may include a GAAFET or nanosheet FET (NSFET).

Figure 2A:
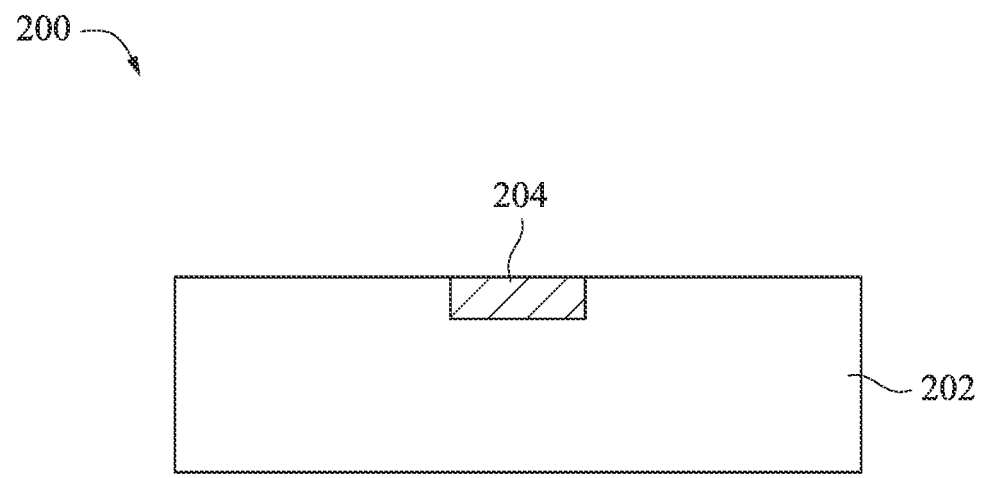
FIG. 2A illustrates a cross-sectional view of the semiconductor device during a fabrication stage in accordance with some embodiments.

Corresponding to operation 102 of FIG. 1, FIG. 2A is a view of the semiconductor device 200 including a semiconductor substrate 202 at one of the various stages of fabrication, according to some embodiments.

The semiconductor substrate 202 includes a semiconductor material substrate, for example, silicon. Alternatively, the substrate 202 may include other elementary semiconductor material such as, for example, germanium. The substrate 202 may also include a compound semiconductor such as silicon carbide, gallium arsenic, indium arsenide, and indium phosphide. Other suitable materials are within the scope of the disclosure. The substrate 202 may include an alloy semiconductor such as silicon germanium, silicon germanium carbide, gallium arsenic phosphide, and gallium indium phosphide. Other suitable materials are within the scope of the disclosure. In one embodiment, the substrate 202 includes an epitaxial layer. For example, the substrate may have an epitaxial layer overlying a bulk semiconductor. Furthermore, the substrate 202 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

The semiconductor substrate 202 may include at least one electrical component 204 formed thereon. The electrical components 204 may be active components (e.g., transistors or the like) and/or passive components (e.g., resistors, capacitors, inductors or the like) that are formed and embedded within the top of semiconductor substrate 202.

Figure 2B:
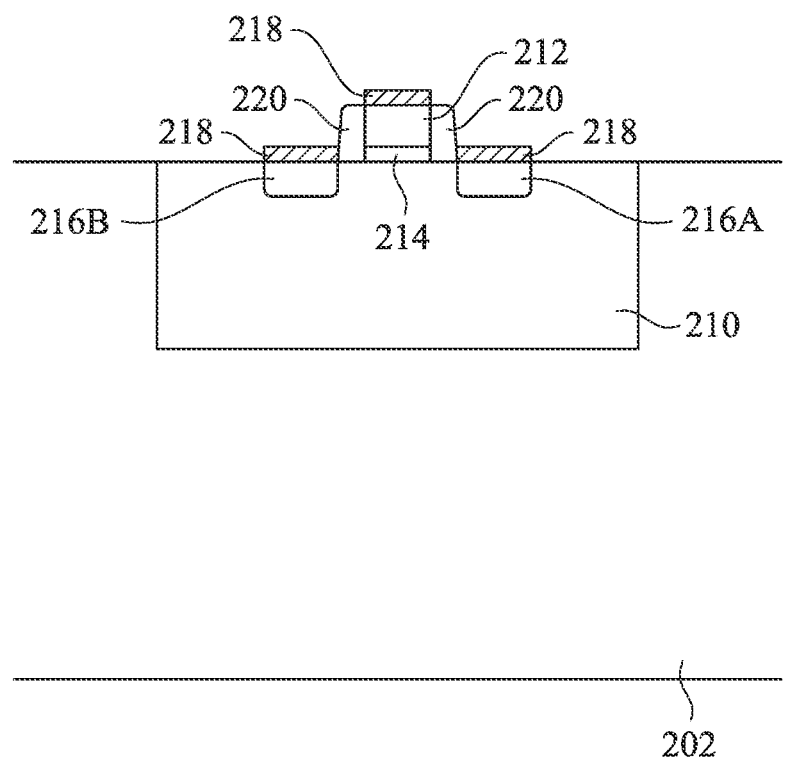
FIG. 2B illustrates a cross-sectional view of an electronic component of the semiconductor device during a fabrication stage in accordance with some embodiments.

Referring to FIG. 2B, an example where the at least one electrical component 204 is a metal oxide semiconductor field effect transistor (MOSFET) is provided. As shown in FIG. 2B, the at least one electrical component 204, MOSFET in this example, includes a well 210, gate 212 above the well 210, source 216A, drain 216B, gate oxide 214, silicide regions 218 and sidewall spacers 220. In the example where the substrate 202 is p-type doped, the well 210 may be n-type doped. As such, the electrical component 204 may be an n-type transistor. Further where the substrate 202 is n-type doped, the well 210 may be p-type doped. As such, the electrical component 204 may be a p-type transistor. Although the transistor is shown as a planar transistor in the illustrated embodiment of FIG. 2A, it is understood that the transistor can include any of other types of transistors (e.g., FinFETs, nanowire transistors, nanosheet transistors) while remaining within the scope of the present disclosure.

In some embodiments, the well 210 may be formed by a doping process to provide the appropriate conductivity type. The well 210 may be formed by exposing a region of the substrate 202 to dopant gas. Alternatively, the well 210 may be formed by implanting a region of the substrate 202 with dopant.

The gate oxide 214 may be formed by depositing an oxide such as by physical vapor deposition (PVD) or chemical vapor deposition (CVD). Alternatively, the gate oxide 214 may be formed by a thermal process where the substrate is heating in an oxygen environment.

The gate 212 may be formed by depositing a gate material followed by patterning the gate material. The gate material may be, for example, polysilicon, or some other conducting material. The gate 212 may be patterned, for example, by a lithographic process, such as photolithography, or by electron beam patterning. For the photolithographic process a photoresist material may be exposed to light through an appropriately patterned mask, and the photoresist material may be developed and patterned. The patterned photoresist may be used as an etch mask to etch and form the gate 212. Alternatively a hard mask may be patterned, such as by a photolithographic process, and the patterned hard mask may be used as an etch mask to etch and form the gate 212. The particular etchant used will depend on the material of the gate 212. The etching process may be anisotropic, for example, such as a dry etch by reactive ion etching (RIE). The gate oxide 214 may patterned during the etch process of the gate 212.

The sidewall spacers 220 may be formed in a self aligned process of depositing a sidewall spacer 220 material over the gate 212 followed by an etch back process. The sidewall spacer 220 material may be a dielectric material such as SiOx or SiN, for example. Other suitable materials are within the scope of the disclosure. The etch back process may remove the sidewall spacer 220 material from all regions except on the sidewalls of the gate 212. The particular etchant used in the etch back of the sidewall spacer 220 material will depend on the particular sidewall spacer 220 material.

The source 216A and drain 216B may be formed in the well 210 using the gate 212 and sidewall spacers 220 as a doping mask. For example, the well 210 may be exposed to an appropriate dopant using the gate 212 and sidewall spacers 220 as a doping mask. The source 216A and drain 216B may be formed by exposing the well 210 using a gas to provide dopant to the well 210. Alternatively, the source 216A and drain 216B may be formed by implanting the well 210 with dopant to the well 210. The source 216A and drain 216B may be doped n-type if the well is p-type. The source 216A and drain 216B may be doped p-type if the well is n-type.

The silicide regions 218 may be formed on the gate 212, the source 216A and the drain 216B to provide good electrical contact to the gate 212, the source 216A and the drain 216B. The silicide regions 218 may be formed by depositing a silicide forming metal on the gate 212, the source 216A and the drain 216B followed by heating. The silicide forming metal may be Ti or Ta, for example. Other suitable materials are within the scope of the disclosure. Heating the silicide forming metal on the gate 212, the source 216A and the drain 216B causes the silicide forming metal to react with the gate 212, the source 216A and the drain 216B forming a silicide. After forming the silicide, the metal which has not reacted may be removed by an etch. The particular etchant will depend on the material of the silicide forming metal.

FIG. 2B illustrates a single transistor as the at least one electrical component 204 for the sake of simplicity. In general, the at least one electrical component may include a plurality of transistors.

Figure 3:
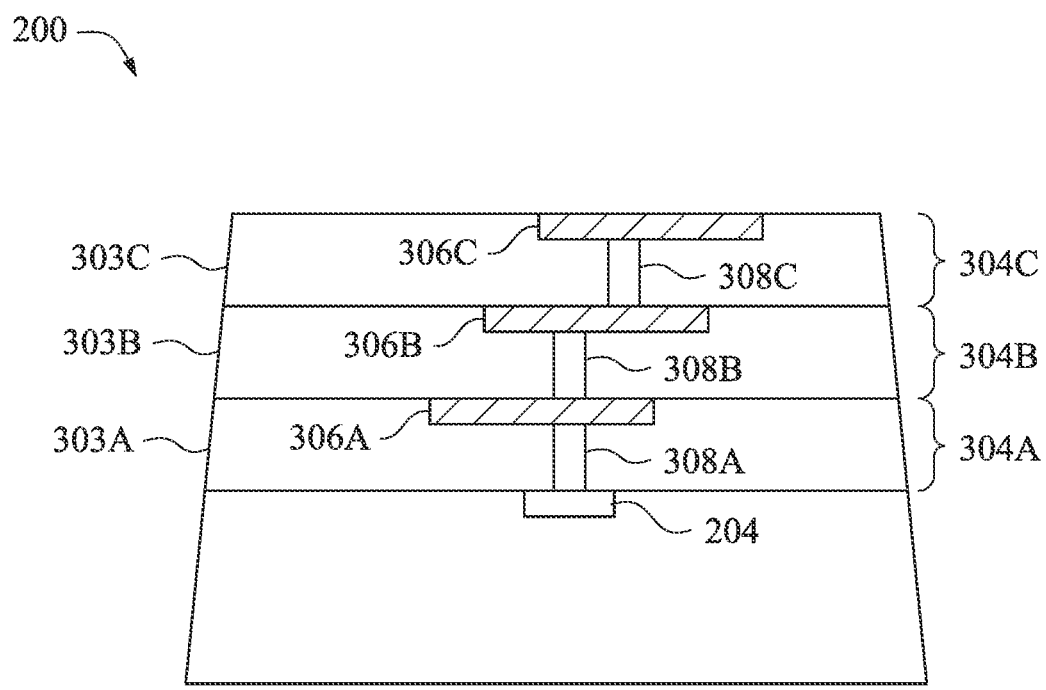
FIG. 3 illustrates a cross-sectional view of the semiconductor device during a fabrication stage in accordance with some embodiments.

FIG. 2B also does not illustrate the electrical connections to the gate 212, the source 216A and the drain 216B by the metallization of the upper level metallization levels for the sake of simplicity. FIG. 3, discussed below, discloses a connection of the electrical component 204 to upper level metallization levels.

Corresponding to operation 104 of FIG. 1, FIG. 3 is a view of the semiconductor device 200 including multiple metallization levels at one of the various stages of fabrication, according to some embodiments.

FIG. 3 illustrates metallization levels 304A, 304B and 304C above the substrate 202 and electrically connected to the at least one electrical component 204. The metallization levels are in order from lowest (nearest the electrical component 204) to highest, and are in the order of 304A, 304B and 304C.

FIG. 3 illustrates only three metallization levels 304A, 304B and 304C for the sake of simplicity. The disclosure is not so limited, and the number of metallization levels may be less than or greater than three.

The metallization levels each include a metallization layer, a dielectric layer and a conducting via which electrically connects to a lower metallization level (or to the at least one electrical component 204 in the case of the lowest metallization level 304A.

The first (lowest) metallization level 304A includes dielectric layer 303A, metallization layer 306A, and conducting via 308A. The metallization layer 306A and the conducting via 308A are disposed in the dielectric 303A.

The dielectric layer 303A may include at least one of: silicon oxide, a comparatively low dielectric constant (k value) dielectric material with a k value less than about 4.0, or combinations thereof. In some embodiments, the dielectric layer 303A is formed of a material, including a low-k dielectric material, an extreme low-k dielectric material, a porous low-k dielectric material, or combinations thereof. The term "low-k" is intended to define a dielectric constant of a dielectric material of 3.0 or less. The term "extreme low-k (ELK)" refers to a dielectric constant of 2.5 or less, and preferably between 1.9 and 2.5. The term "porous low-k" refers to a dielectric constant of a dielectric material of 2.0 or less, and preferably 1.5 or less. A wide variety of low-k materials may be employed by some embodiments of the present disclosure such as, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material. Other suitable materials are within the scope of the disclosure.

The conducting via 308A may be formed by forming a via hole in the dielectric layer 303A followed by forming a conducting material in the via hole. The conducting material may be tungsten, for example. The via hole may be formed in the dielectric layer 303A by a lithographic process, such as photolithography, or by electron beam patterning. For the photolithographic process a photoresist material may be exposed to light through an appropriately patterned mask, and the photoresist material may be developed and patterned. The patterned photoresist may be used as an etch mask to etch and form the via hole in the dielectric layer 303A. The etching process may be anisotropic, for example, such as a dry etch by RIE.

Once the via hole is formed, the conducting material, such as tungsten, may be formed in the via hole to form the conducting via 308A. The conducting material may then be polished, for example, by chemical mechanical polishing (CMP) to remove the conducting material from a top of the dielectric layer 303A to leave the conducting material only in the via hole. In FIG. 3, the conducting via 308A electrically contacts the at least one electrical component 204 and the metallization layer 306A.

The metallization layer 306A may be formed of a conducting material such as aluminum or copper, for example, and may be formed contacting the conducting via 308A. The metallization layer 306A may be formed by depositing the conducting material followed by patterning the deposited conducting material. The metallization layer 306A may be patterned, for example, by a lithographic process, such as photolithography, or by electron beam patterning. For the photolithographic process a photoresist material may be exposed to light through an appropriately patterned mask, and the photoresist material may be developed and patterned. The patterned photoresist may be used as an etch mask to etch and form the metallization layer 306A. The particular etchant used will depend on the material of the metallization layer 306A. The etching process may be anisotropic, for example, such as a dry etch by RIE.

The dielectric layer 303B of the metallization level 304B may include at least one of: silicon oxide, a comparatively low dielectric constant (k value) dielectric material with a k value less than about 4.0, or combinations thereof, in a similar fashion to the dielectric layer 303A of the metallization level 304A.

The conducting via 308B of the metallization level 304B may be formed by forming a via hole in the dielectric layer 303B followed by forming a conducting material in the via hole in a similar fashion to the conducting via 308A of the metallization level 304A. The metallization layer 306B of the metallization level 304B may be formed in a similar fashion to the metallization layer 306A of the metallization level 304A. In FIG. 3, the conducting via 308B electrically contacts the metallization layer 306A and the metallization layer 306B.

The dielectric layer 303C of the metallization level 304C may include at least one of: silicon oxide, a comparatively low dielectric constant (k value) dielectric material with a k value less than about 4.0, or combinations thereof, in a similar fashion to the dielectric layer 303A of the metallization level 304A.

The metallization level 304C is the top most metallization level and includes the top most metallization layer 306C.

The conducting via 308C of the topmost metallization level 304C may be formed by forming a via hole in the dielectric layer 303C followed by forming a conducting material in the via hole in a similar fashion to the conducting via 308A of the metallization level 304A. The topmost metallization layer 306C of the metallization level 304C may be formed in a similar fashion to the metallization layer 306A of the metallization level 304A. In FIG. 3, the conducting via 308C electrically contacts the metallization layer 306B and the metallization layer 306C.

Figure 4:
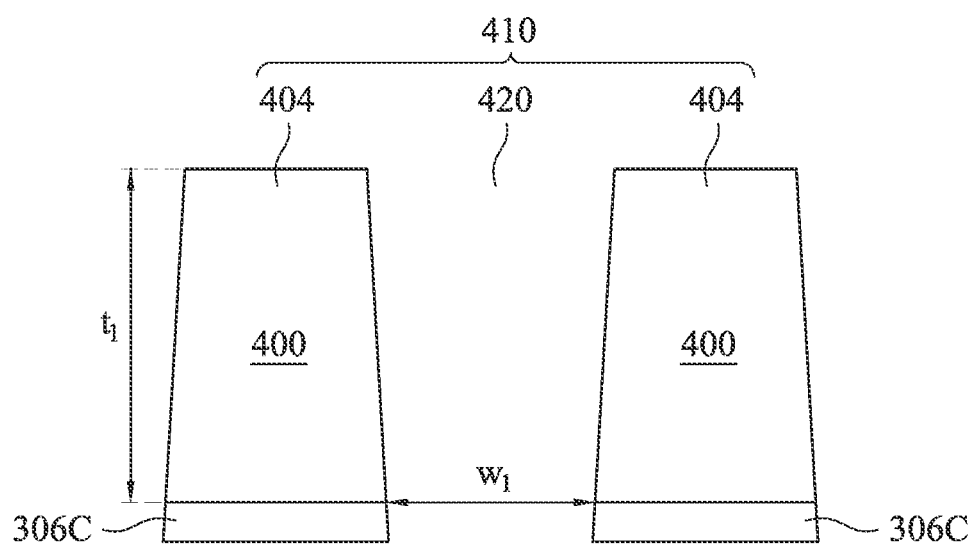
FIG. 4 illustrates a cross-sectional view of the semiconductor device during a fabrication stage in accordance with some embodiments.

Corresponding to operation 106 of FIG. 1, FIG. 4 is a view of the semiconductor device 200 including a patterned wiring layer including a plurality of wiring portions at one of the various stages of fabrication, according to some embodiments.

The patterned wiring layer 410 includes wiring portions 400. The patterned wiring layer 410 may be formed so as to contact the underlying topmost metallization layer 306C.

The patterned wiring layer 410 may be formed of a conducting material such as Al or an Al alloy, for example. Other materials are within the scope of the disclosure The patterned wiring layer 410 may be formed by depositing the conducting material, followed by patterning the conducting material. The conducting material may be patterned, for example, by a lithographic process, such as photolithography, or by electron beam patterning. For the photolithographic process a photoresist material may be exposed to light through an appropriately patterned mask, and the photoresist material may be developed and patterned. The patterned photoresist may be used as an etch mask to etch and form the patterned wiring layer 410. The particular etchant used will depend on the material of the patterned wiring layer 410. The etching process may be anisotropic, for example, such as a dry etch by RIE.

The patterned wiring layer 410 can be formed to have wiring portions 400. FIG. 4 shows two wiring portion 400 for the sake of simplicity. The wiring portions 400 may be more than 2. Adjacent of the wiring portions 400 are separated from each other by regions between the wiring portions, such as by a recess 420. Adjacent of the wiring portions 400 are separated from each other by a distance W1, and a thickness of the wiring portions 400 is t1 as shown in FIG. 4. The aspect ratio of the recess 420 between adjacent wiring portions 400 is t1/W1. The aspect ratio may be greater than 1.0. Other values are within the scope of the disclosure.

Figure 5:
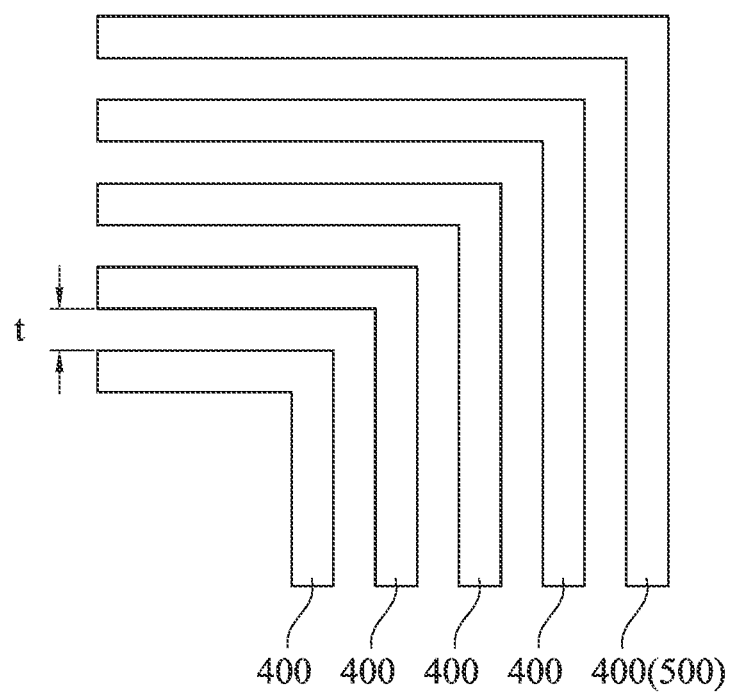
FIG. 5, illustrates a top view of the semiconductor device during a fabrication stage in accordance with some embodiments.

FIG. 5 is a top view of the wiring portions 400 in some embodiments (see also FIGS. 6-10 for wiring portions 400) where the wiring portions 400 are wiring lines 500. The wiring lines 500 may have a separation between adjacent wiring lines 500 of less than 2.5 μm, for example. Other values are within the scope of the disclosure. As shown in FIG. 5, the number of wiring lines 500 (which are the wiring portions 400) is five. The disclosure is not so limited and the number of wiring lines 500 may be less than, or more than five. The wiring lines 500 may be parallel to each other. According to some embodiments, the wiring lines 500 may follow a straight line for a distance, and may turn at an angle, such as a 90° angle, for example, as shown in FIG. 5.

Figure 6:
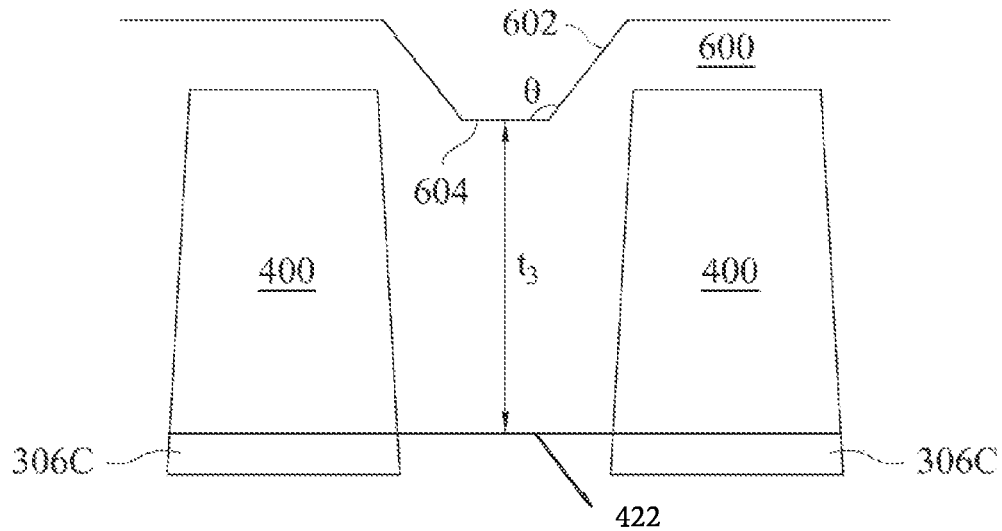
FIG. 6 illustrates a cross-sectional view of the semiconductor device during a fabrication stage in accordance with some embodiments.

Corresponding to operation 108 of FIG. 1, FIG. 6 is a view of the semiconductor device 200 including a first passivation layer 600 formed over wiring portions 400 at one of the various stages of fabrication, according to some embodiments.

The first passivation layer 600 (first insulating passivation layer) may be formed over the wiring portions 400 and in a region between adjacent of the wiring portions 400. The first passivation layer 600 may be formed in the recess 420 between the wiring portions 400.

The first passivation layer 600 is formed so as to have a side surface 602 and a horizontal surface 604 in the region between adjacent of the wiring portions 400. The side surface 602 makes an angle θ of greater than 103° with the respect to the horizontal surface 604. Other values are within the scope of the disclosure. The horizontal surface 604 may in some embodiment be short in extent, and may be a small portion of a curved surface of the first passivation layer 600, where the tangent of the curve is horizontal. The distance between the horizontal surface 604 and a bottom 422 of the recess 420 is t3. A ratio of t3 to t1 may be greater than 0.3, for example. Other values are within the scope of the disclosure.

Setting the angle θ to be greater than 103° helps prevent formation of a void when a subsequent second passivation layer 700 (see FIG. 7) is formed on the first passivation layer 600. Such an angle helps prevent void formation in the subsequent second passivation layer 700.

The first passivation layer 600 may be formed of an appropriate insulating material, such as SiOx or SiN. Other suitable materials are within the scope of the disclosure. According to some embodiments, the first passivation layer 600 may be formed of $SiO_2$ in an undoped silicate glass (USG) formation process, or a high density plasma (HDP) operation. The first passivation layer 600 may be formed in an HDP process including both a HDP deposition process and a HDP sputter etch process. The HDP deposition process deposits $SiO_2$, while the HDP sputter etch process removes $SiO_2$. The sputter etch in the HDP process can inhibit overhangs formed on the resulting first passivation layer 600 compared with the case where no sputter etch occurs in the HDP process. The sputter etch allows for the structure of the side surface 602 to make an angle θ of greater than 103° with the respect to the horizontal surface 604. Thus, the sputter etch helps prevent formation of a void when a subsequent second passivation layer 700 (see FIG. 7) is formed on the first passivation layer 600. Such an angle helps prevent void formation in the subsequent second passivation layer 700.

According to some embodiments, the first passivation layer 600 may be formed of $SiO_2$ in a HDP operation, where the rate of the HDP deposition process and the HDP sputter etch process are such that the ratio of the deposition rate to the sputtering rate is 0.5 to 6. Other values are within the scope of the disclosure. As an example, the HDP operation may be performed through control of radio frequency (RF) power. Source gases may include, for example, $SiH_4$ and $O_2$. Carrier gases may include at least one of Ar, He, or $N_2$. The high frequency radio frequency (HFRF) applied at 13.56 MHz may have a power of 1000-3000 W. The low frequency radio frequency (LFRF) applied at 300-800 kHz may have a power of 2000-8000 W. The Bias power may be in the range 500-5000 W. Other suitable process parameters are within the scope of the disclosure.

Figure 7:
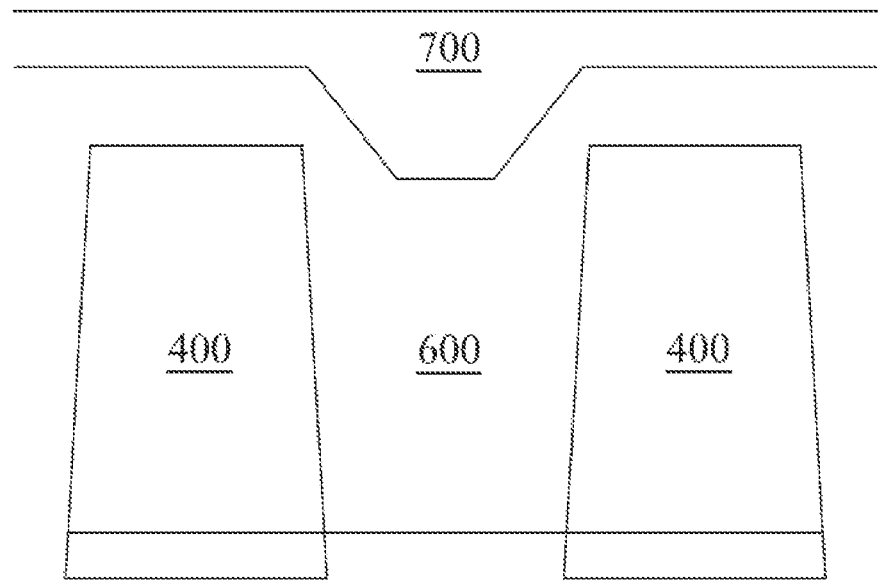
FIG. 7 illustrates a cross-sectional view of the semiconductor device during a fabrication stage in accordance with some embodiments.

Corresponding to operation 110 of FIG. 1, FIG. 7 is a view of the semiconductor device 200 including a second passivation layer 700 (second insulating passivation layer) formed over the first passivation layer 600 at one of the various stages of fabrication, according to some embodiments.

The second passivation layer 700 may be formed of an insulating material such as SiOx or SiN, for example. As discussed above, setting the angle θ to be greater than 103° helps prevent formation of a void when the second passivation layer 700 is formed on the first passivation layer 600. Such an angle helps prevent void formation in the second passivation layer 700.

According to some embodiments, the second passivation layer 700 may be $SiO_2$, and the process for forming $SiO_2$ may be a plasma enhanced tetraethyl orthosilicate (PETEOS) deposition process. The second passivation layer 700 is formed to have a compressive stress in some embodiments. The second insulating passivation layer 700 with compressive stress can compensate for tensile stress in the wiring portions 400. Thus, passivation layer cracks may be reduced. As an example, the PETEOS operation may be performed using source gases, which may include, for example, $O_2$ and tetraethylorthosilicate (TEOS). The deposition temperature may be 200-450° C. Carrier gases may include at least one of Ar, He, or $N_2$. The HFRF applied at 13.56 MHz may have a power of 50-3000 W. The LFRF applied at 300-800 kHz may have a power of 50-2500 W. Other suitable process parameters are within the scope of the disclosure. The compressive stress is controlled by the HFRF and LFRF power, especially the LFRF power. As the RF power increases, the film stress becomes more compressive.

Figure 8:
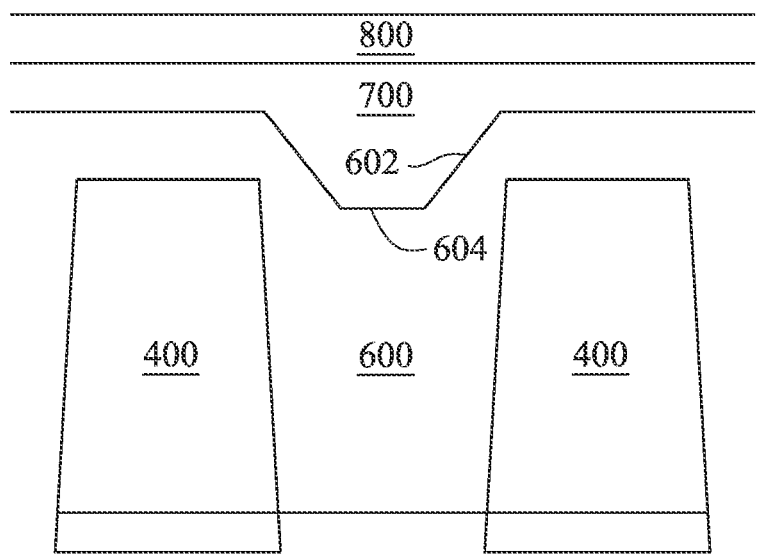
FIG. 8 illustrates a cross-sectional view of the semiconductor device during a fabrication stage in accordance with some embodiments.

Corresponding to operation 112 of FIG. 1, FIG. 8 is a view of the semiconductor device 200 including a third passivation layer 800 (third insulating passivation layer) formed over the second passivation layer 700 at one of the various stages of fabrication, according to some embodiments.

The third passivation layer 800 may be formed of an insulating material such as SiOx or SiN, for example. Other suitable materials are within the scope of the disclosure. According to some embodiments, the third passivation layer 800 may be SiN, and the process for forming SiN may be a plasma enhanced silicon nitride (PESN) deposition process. As an example, the PESN operation may be performed using source gases, which may include, for example, $SiH_4$ and $NH_3$ or $N_2$. The deposition temperature may be 200-450° C. Carrier gases may include at least one of Ar, He, or $N_2$. The HFRF applied at 13.56 MHz may have a power of 50-2000 W. The LFRF applied at 300-800 kHz may have a power of 50-2000 W. Other suitable process parameters are within the scope of the disclosure.

Figure 9:
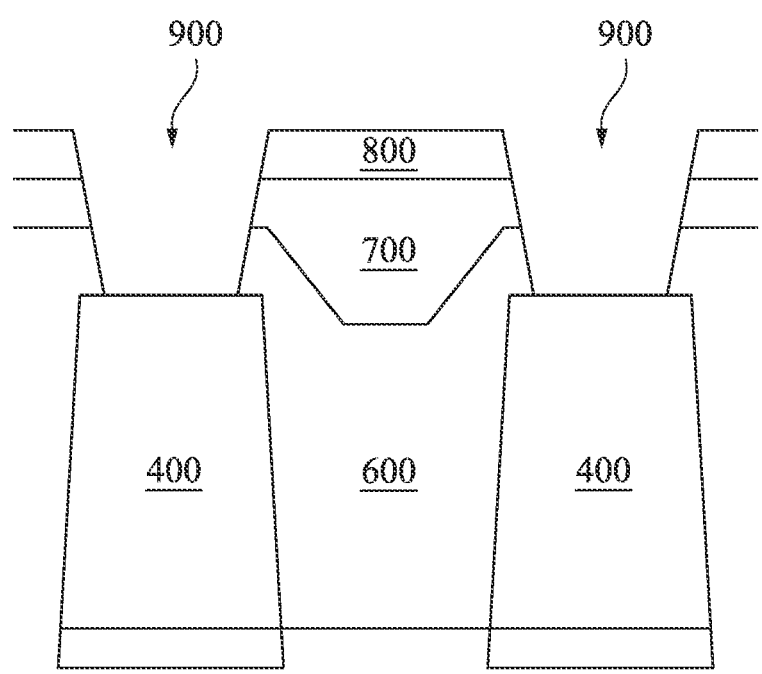
FIG. 9 illustrates a cross-sectional view of the semiconductor device during a fabrication stage in accordance with some embodiments.

Corresponding to operation 114 of FIG. 1, FIG. 9 is a view of the semiconductor device 200 including the wiring portions 400 arranged as bonding pads at one of the various stages of fabrication, according to some embodiments.

Via holes 900 may be formed through the first passivation layer 600, the second passivation layer 700, and the third passivation layer 800 to expose the underlying wiring portions 400 arranged as bonding pads. The via holes 900 may be formed by, for example, a lithographic process, such as photolithography, or by electron beam patterning. For the photolithographic process a photoresist material may be exposed to light through an appropriately patterned mask, and the photoresist material may be developed and patterned. The patterned photoresist may be used as an etch mask to etch the first passivation layer 600, the second passivation layer 700, and the third passivation layer 800 to form the via holes 900 therein. Alternatively a hard mask may be patterned, such as by a photolithographic process, and the patterned hard mask may be used as an etch mask to etch the first passivation layer 600, the second passivation layer 700, and the third passivation layer 800 to form the via holes 900 therein. The particular etchant used will depend on the material of the first passivation layer 600, the second passivation layer 700, and the third passivation layer 800.

Different etchants may be used for the first passivation layer 600, the second passivation layer 700, and the third passivation layer 800. The etching process may be anisotropic, for example, such as a dry etch by RIE.

Figure 10:
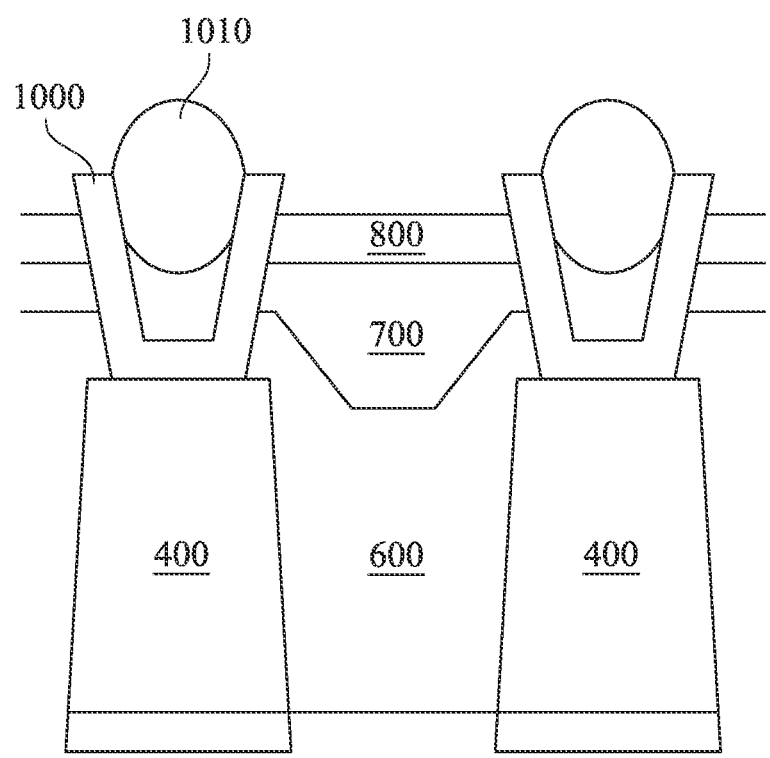
FIG. 10 illustrates a cross-sectional view of the semiconductor device during a fabrication stage in accordance with some embodiments

In some embodiments, a bump pad and bump may be formed on each of the wiring portions 400. Corresponding to operation 116 of FIG. 1, FIG. 10 is a view of the semiconductor device 200 including the bump pads 1000 and bumps 1010 at one of the various stages of fabrication, according to some embodiments. The bump pad 1000 is disposed in the via opening 900 in the first passivation layer 600, the second passivation layer 700, and the third passivation layer 800, wherein the bump pad 1000 is physically connected to the underlying wiring portions 400 arranged as bonding pads. In some embodiments, the bump pad 1000 is for example, under-ball metallurgy (UBM) patterns used for ball mount. In some embodiments, the materials of the bump pad 1000 may include copper, nickel, titanium, tungsten, or alloys thereof or the like, and may be formed by an electroplating process, for example.

The bump pad 1000 may be patterned, for example, by a lithographic process, such as photolithography, or by electron beam patterning. For the photolithographic process a photoresist material may be exposed to light through an appropriately patterned mask, and the photoresist material may be developed and patterned. The patterned photoresist may be used as an etch mask to etch and form the bump pad 1000. Alternatively a hard mask may be patterned, such as by a photolithographic process, and the patterned hard mask may be used as an etch mask to etch and form the bump pad 1000. The particular etchant used will depend on the material of the bump pad 1000. The etching process may be anisotropic, for example, such as a dry etch by RIE.

After forming the bump pad 1000, a bump 1010 is disposed on the bump pad 1000 for each of the bump pads 1000, wherein the bump 1010 is electrically connected to the wiring portion 400 through the bump pad 1000 for each of the wiring portions 400. In some embodiments, the bump 1010 is disposed on the bump pad 1000 by a ball placement process or reflow process. In some embodiments, the bump 1010 is solder balls or ball grid array (BGA) balls. In some embodiments, the bump 1010 is, for example, controlled collapse chip connection (C4) bumps or micro-bumps. The disclosure is not limited thereto. Referring to FIG. 10, only two bump pads 1000 and two bumps 1010 are shown for simplification. However, it should be noted that more than two bump pads 1000 and more than two bumps 1010 are contemplated.

In one aspect of the present disclosure, a method of fabricating a semiconductor device is disclosed. A semiconductor substrate having at least one electrical component is provided. A patterned wiring layer is formed above the semiconductor substrate. The patterned wiring layer includes a plurality of wiring portions, where adjacent of the wiring portions are separated from each other. A first insulating passivation layer is formed over the wiring portions in a region between adjacent of the wiring portions. The first insulating passivation layer has a horizontal surface in the region between adjacent of the wiring portions. A second insulating passivation layer is formed on the first insulating passivation layer, wherein the first insulating passivation layer and the second insulating passivation layer do not have a void in the region between adjacent wiring lines.

In another aspect of the present disclosure, a method of making a semiconductor device is disclosed. A semiconductor substrate having at least one electrical component is provided. A patterned wiring layer is formed above the semiconductor substrate. The patterned wiring layer includes a plurality of wiring portions, adjacent of the wiring portions separated from each other. A first insulating passivation layer is formed over the wiring portions in a region between adjacent of the wiring portions. The first insulating passivation layer has a horizontal surface in the region between adjacent of the wiring portions. A second insulating passivation layer is formed on the first insulating passivation layer, wherein the second insulating passivation layer has compressive stress.

In another aspect of the present disclosure, a semiconductor device is disclosed. The semiconductor device includes a substrate having at least one electrical component. A patterned wiring layer is disposed above the semiconductor substrate. The patterned wiring layer includes a plurality of wiring portions, adjacent of the wiring portions separated from each other. A first insulating passivation layer is disposed over the wiring portions in a region between adjacent of the wiring portions. The first insulating passivation layer has a horizontal surface in the region between adjacent of the wiring portions. A second insulating passivation layer is disposed on the first insulating passivation layer, wherein the first insulating passivation layer has a side surface which makes an angle with the horizontal surface of greater than 103°.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
   providing a semiconductor substrate having at least one electrical component;
   forming a patterned wiring layer above the semiconductor substrate, the patterned wiring layer including a plurality of wiring portions, wherein sidewalls of adjacent wiring portions are separated from each other, the sidewalls making a first angle with a horizontal surface in a region between the adjacent wiring portions;
   forming a first insulating passivation layer over the wiring portions in the region between the adjacent wiring portions, the first insulating passivation layer having the horizontal surface, wherein the first insulating passivation layer has a side surface which makes an angle with the horizontal surface of greater than:
   the first angle; and
   103°; and
   forming a second insulating passivation layer on the first insulating passivation layer,
   wherein the first insulating passivation layer and the second insulating passivation layer do not have a void in the region between adjacent wiring lines.

2. The method of fabricating a semiconductor device according to claim 1, wherein the first insulating passivation layer includes SiOx and is formed using an undoped silicate glass (USG) or a high density plasma (HDP) deposition technique.

3. The method of fabricating a semiconductor device according to claim 1, wherein the first insulating passivation layer includes SiOx and is formed using a high density plasma (HDP) deposition technique wherein the SiOx first insulating passivation layer has a deposition rate and a sputtering rate, wherein a ratio of the deposition rate to the sputtering rate is 2-4.

4. The method of fabricating a semiconductor device according to claim 1, wherein the second insulating passivation layer includes SiOx and is formed using a plasma enhanced tetraethyl orthosilicate (PETEOS) deposition technique.

5. The method of fabricating a semiconductor device according to claim 1, further comprising forming a third insulating passivation layer on the second insulating passivation layer.

6. The method of fabricating a semiconductor device according to claim 5, wherein the third insulating passivation layer includes SiN and is formed using a plasma enhanced deposition method.

7. The method of fabricating a semiconductor device according to claim 1, wherein the second insulating passivation layer has compressive stress.

8. The method of fabricating a semiconductor device according to claim 7, wherein the wiring portions have a tensile stress.

9. The method of fabricating a semiconductor device according to claim 7, further comprising forming a third insulating passivation layer on the second insulating passivation layer.

10. A method of fabricating a semiconductor device, comprising:
    providing a semiconductor substrate having at least one electrical component;

forming a patterned wiring layer above the semiconductor substrate, the patterned wiring layer including a plurality of wiring portions in which sidewalls of adjacent wiring portions are separated from each other, the sidewalls making a first angle with a horizontal surface in a region between the adjacent wiring portions;

forming a first insulating passivation layer having a first compressive stress over the wiring portions in the region between the adjacent wiring portions, the first insulating passivation layer having the horizontal surface, wherein the first insulating passivation layer has a side surface which makes an angle with the horizontal surface of greater than the first angle and 103°; and forming a second insulating passivation layer on the first insulating passivation layer, wherein the second insulating passivation layer has a second compressive stress greater than the first compressive stress, the first compressive stress exceeding a third compressive stress of a layer disposed over the second insulating layer.

11. The method of fabricating a semiconductor device according to claim 10, wherein the wiring portions have a tensile stress.

12. The method of fabricating a semiconductor device according to claim 10, further comprising forming a third insulating passivation layer on the second insulating passivation layer.

13. The method of fabricating a semiconductor device according to claim 10, wherein the first insulating passivation layer includes SiOx and is formed using an undoped silicate glass (USG) or a high density plasma (HDP) deposition technique.

14. The method of fabricating a semiconductor device according to claim1 10, wherein the first insulating passivation layer includes SiOx and is formed using a high density plasma (HDP) deposition technique wherein the SiOx first insulating passivation layer has a deposition rate and a sputtering rate, wherein a ratio of the deposition rate to the sputtering rate is 2-4.

15. The method of fabricating a semiconductor device according to claim 10, wherein the second insulating passivation layer includes SiOx and is formed using a plasma enhanced tetraethyl orthosilicate (PETEOS) deposition technique.

16. The method of fabricating a semiconductor device according to claim 10, further comprising forming a third insulating passivation layer on the second insulating passivation layer.

17. The method of fabricating a semiconductor device according to claim 16, wherein the third insulating passivation layer includes SiN and is formed using a plasma enhanced deposition method.

18. A method of fabricating a semiconductor device, comprising:

providing a semiconductor substrate having at least one electrical component;

forming a patterned wiring layer above the semiconductor substrate, the patterned wiring layer including a plurality of wiring portions in which sidewalls of adjacent wiring portions are separated from each other, the sidewalls making a first angle with a horizontal surface in a region between the adjacent wiring portions;

forming a first insulating passivation layer having a first compressive stress over the wiring portions in the region between the adjacent wiring portions, the first insulating passivation layer having the horizontal surface, wherein the first insulating passivation layer has a side surface which makes an angle with the horizontal surface of greater than the first angle and 103°; and forming a second insulating passivation layer on the first insulating passivation layer.

19. The method of claim 18, wherein the first insulating passivation layer includes SiOx and is formed using an undoped silicate glass (USG) or a high density plasma (HDP) deposition technique.

20. The method of claim 18, wherein the first insulating passivation layer includes SiOx and is formed using a high density plasma (HDP) deposition technique wherein the SiOx first insulating passivation layer has a deposition rate and a sputtering rate, wherein a ratio of the deposition rate to the sputtering rate is 2-4.

21. The method of claim 18, wherein the second insulating passivation layer includes SiOx and is formed using a plasma enhanced tetraethyl orthosilicate (PETEOS) deposition technique.

* * * * *